(12) United States Patent
Kumano

(10) Patent No.: US 9,627,433 B2
(45) Date of Patent: Apr. 18, 2017

(54) METHOD OF MANUFACTURING JUNCTION FIELD EFFECT TRANSISTOR

(71) Applicant: CANON KABUSHIKI KAISHA, Tokyo (JP)

(72) Inventor: Hideomi Kumano, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/836,811

(22) Filed: Aug. 26, 2015

(65) Prior Publication Data

US 2016/0064449 A1 Mar. 3, 2016

(30) Foreign Application Priority Data

Aug. 29, 2014 (JP) ................................ 2014-176298

(51) Int. Cl.
*H01L 29/66* (2006.01)
*H01L 29/808* (2006.01)
*H01L 29/10* (2006.01)
*H01L 27/146* (2006.01)
*H01L 21/266* (2006.01)
(Continued)

(52) U.S. Cl.
CPC ...... *H01L 27/14679* (2013.01); *H01L 21/266* (2013.01); *H01L 21/26513* (2013.01); *H01L 21/324* (2013.01); *H01L 27/14612* (2013.01); *H01L 27/14683* (2013.01);
(Continued)

(58) Field of Classification Search
CPC ......... H01L 27/14679; H01L 29/66893; H01L 29/7832; H01L 29/8086; H01L 2924/13062; H01L 27/146; H01L 27/14603; H01L 27/14605; H01L 27/14612; H01L 27/14616; H01L 27/1463; H04N 5/335; H04N 5/369; H04N 5/374; H04N 5/3745
See application file for complete search history.

(56) References Cited

U.S. PATENT DOCUMENTS 4,573,257 A * 3/1986 Hulseweh ............. H01L 21/033
148/DIG. 102
4,642,881 A * 2/1987 Matsukawa ....... H01L 21/26513
148/DIG. 82
(Continued)

FOREIGN PATENT DOCUMENTS

JP 2006-049508 A 2/2006

*Primary Examiner* — Allen Parker
*Assistant Examiner* — Gustavo Ramallo
(74) *Attorney, Agent, or Firm* — Canon U.S.A. Inc., IP Division

(57) ABSTRACT

A method of manufacturing a junction field effect transistor having a channel region disposed in a semiconductor substrate, deeper than one of a source region and a drain region, the method includes a first step of forming a first mask having a first opening portion over the semiconductor substrate in which a first semiconductor region of a first conductivity type is disposed, a second step of forming a second semiconductor region of a second conductivity type defined as the channel region, in the first semiconductor region by implantation of ions of second conductivity type opposite to the first conductivity type using the first mask, and a third step of forming a third semiconductor region of the second conductivity type defined as the one of the source region and the drain region, by implantation of ions of the second conductivity type, using the first mask.

10 Claims, 7 Drawing Sheets

(51) Int. Cl.
*H01L 21/265* (2006.01)
*H01L 21/324* (2006.01)

(52) U.S. Cl.
CPC .... *H01L 29/1058* (2013.01); *H01L 29/66909* (2013.01); *H01L 29/8083* (2013.01); *H01L 27/14636* (2013.01)

(56) References Cited

U.S. PATENT DOCUMENTS

| | | | | |
|---|---|---|---|---|
| 4,675,981 A * | 6/1987 | Naruke | ................ | H01L 21/266 148/DIG. 104 |
| 4,748,103 A * | 5/1988 | Hollinger | .............. | H01L 21/033 257/E21.033 |
| 4,912,053 A * | 3/1990 | Schrantz | ................ | H01L 21/82 257/274 |
| 5,028,552 A * | 7/1991 | Ushiku | ................ | H01L 21/266 148/DIG. 82 |
| 5,792,699 A * | 8/1998 | Tsui | ...................... | H01L 21/266 257/E21.346 |
| 5,814,544 A * | 9/1998 | Huang | ................ | H01L 29/1083 257/E21.428 |
| 7,348,228 B2 * | 3/2008 | Wu | ..................... | H01L 29/1058 257/134 |
| 8,017,476 B2 * | 9/2011 | Banna | ................ | H01L 29/0692 257/270 |
| 2002/0030225 A1 * | 3/2002 | Nakamura | .......... | H01L 29/0615 257/338 |
| 2004/0014303 A1 * | 1/2004 | Layman | ............ | H01L 21/82380 438/525 |
| 2006/0049435 A1 * | 3/2006 | Bill | ........................ | H01L 27/10 257/278 |
| 2007/0298579 A1 * | 12/2007 | Hu | ...................... | H01L 21/2253 438/377 |
| 2008/0273398 A1 * | 11/2008 | Vora | ...................... | G11C 11/404 365/185.26 |
| 2010/0244106 A1 * | 9/2010 | Parker | .............. | H01L 21/26513 257/288 |
| 2013/0270610 A1 * | 10/2013 | Suess | ................ | H01L 27/14643 257/258 |

* cited by examiner

METHOD OF MANUFACTURING JUNCTION FIELD EFFECT TRANSISTOR

BACKGROUND OF THE INVENTION

Field of the Invention

The present invention relates to a method of manufacturing a junction field effect transistor, a method of manufacturing a semiconductor apparatus, a junction field effect transistor, and an imaging apparatus using the junction field effect transistor.

Description of the Related Art

As a junction field effect transistor (JFET), a JFET having a channel region disposed to be parallel with a surface of a semiconductor substrate, and a JFET having a channel region disposed to be perpendicular to a surface of a semiconductor substrate are proposed.

In Japanese Patent Application Laid-Open No. 2006-049508, a JFET has a configuration in which an N-type source region, an N-type channel region, and an N-type drain region are formed at a position at which the regions are superposed in plan view in this order from a surface of a semiconductor substrate in a depth direction.

SUMMARY OF THE INVENTION

According to an aspect of the present invention, there is provided a method of manufacturing a junction field effect transistor having a channel region disposed at a position of a semiconductor substrate, deeper than one of a source region and a drain region. The method includes a first step of forming a first mask over the semiconductor substrate in which a first semiconductor region of a first conductivity type is disposed, the first mask having a first opening portion disposed to be surrounded by the first semiconductor region in plan view, a second step of forming a second semiconductor region of a second conductivity type defined as at least part of the channel region, in a partial area of the first semiconductor region by implantation of ions of the second conductivity type opposite to the first conductivity type using the first mask, and a third step of forming a third semiconductor region of the second conductivity type defined as the one of the source region and the drain region, by the implantation of ions of the second conductivity type, using the first mask.

Further features of the present invention will become apparent from the following description of exemplary embodiments (with reference to the attached drawings).

DESCRIPTION OF THE EMBODIMENTS

Figure 1A:
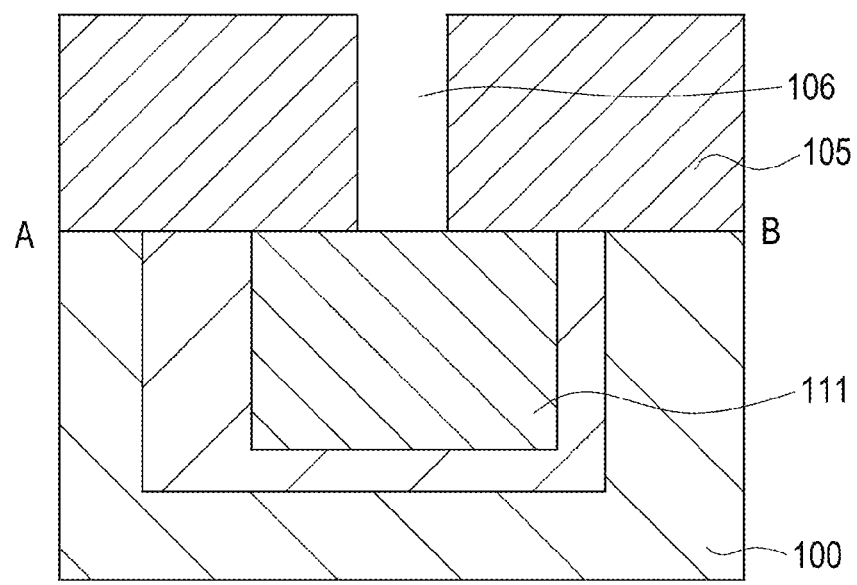
FIGS. 1A and 1B are schematic cross-sectional views illustrating a method of manufacturing a JFET.
Figure 1B:
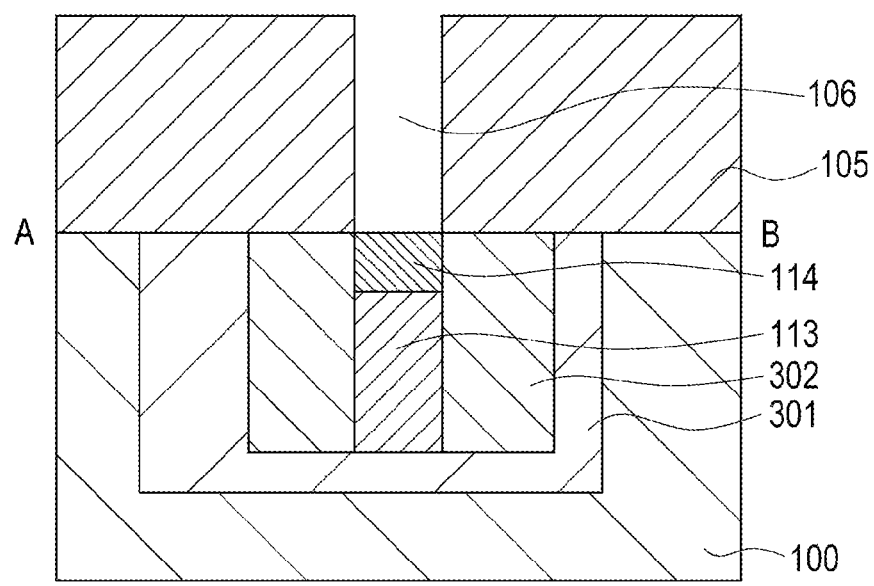

In FIGS. 1A and 1B, a method of manufacturing a JFET according to an embodiment of the present invention will be described. A JFET obtained by the method of manufacturing a JFET according to the present embodiment has a configuration in which a channel region is disposed at a position of a semiconductor substrate, below the surface of the semiconductor substrate, deeper than one of a source region and a drain region.

Figure 2A:
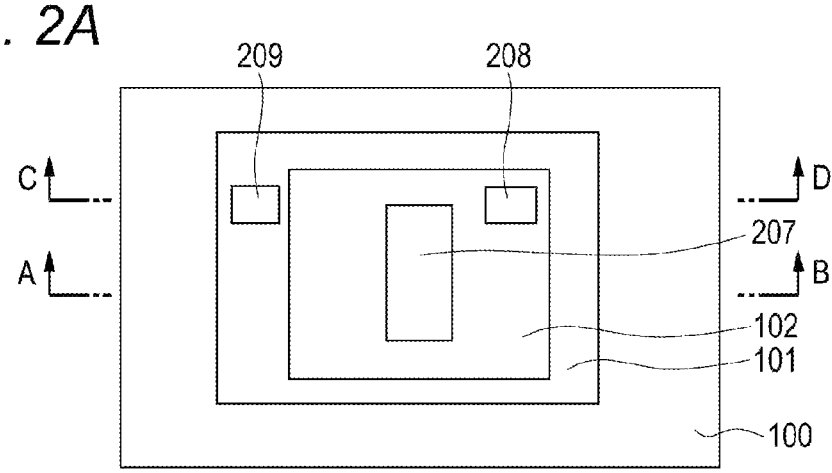
FIG. 2A is a schematic plan view of a JFET.
Figure 2B:
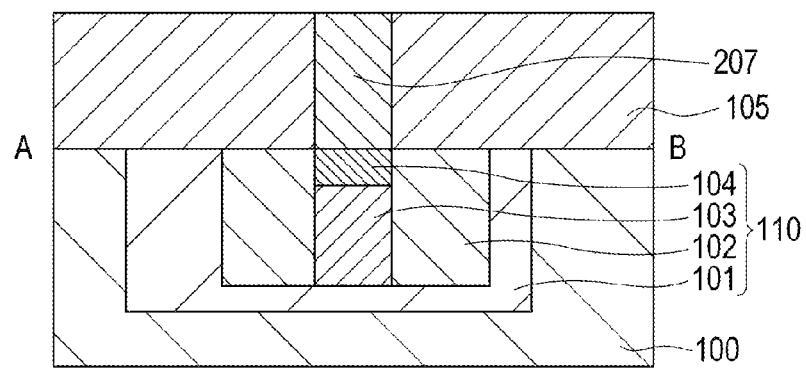
FIGS. 2B and 2C are schematic cross-sectional views of the JFET.

FIG. 2B is a schematic cross-sectional view illustrating an example of a JFET obtained by the method of manufacturing a JFET according to the present embodiment. In this example, the JFET has a configuration in which a channel region 103 is disposed at a position of a semiconductor substrate 100, deeper than a source region 104 being one of the source region and a drain region, below the surface of the semiconductor substrate.

The source region 104 and the channel region 103 are disposed so that the outer edges thereof superpose each other, in plan view. Further, the channel region 103 is surrounded by a gate region 102, and the drain region 101 being the other of the source region and the drain region is partially disposed at a position deeper than the channel region 103.

An example of the channel region disposed at a position deeper than the source region will be described below.

It is noted that, in the present specification, in order to describe relative positional relationships between semiconductor regions, description "surface of the semiconductor substrate" of "deeper below the surface of the semiconductor substrate" represents a surface on a side on which a wiring layer electrically connected to the semiconductor regions disposed in the semiconductor substrate is disposed. Description "depth" represents a distance in a direction from the surface toward a depth of the semiconductor substrate. Further description "below the surface of the semiconductor substrate" is sometimes omitted and simply expressed as "depth", but the description "depth" means "deeper below the surface of the semiconductor substrate".

First, in FIG. 1A, a mask (first mask) 105 having an opening portion (first opening portion) 106 disposed to be surrounded by a first semiconductor region 111, in plan view, is formed over the semiconductor substrate 100 in which a first semiconductor region 111 of first conductivity type is disposed (first step).

In FIG. 1B, the mask 105 is used to perform implantation of ions of the second conductivity type opposite to the first conductivity type, in the semiconductor substrate 100. The implantation of the ions partially changes the conductivity type of the first semiconductor region 111 to the second conductivity type, and a second semiconductor region 113 as the channel region is formed (second step).

Then, the mask 105 is used to perform implantation of ions of the second conductivity type in the semiconductor substrate 100. Therefore, a third semiconductor region 114 as the source region of the JFET 110 is formed in a partial area of the semiconductor substrate 100, including the surface of the semiconductor substrate 100 (third step).

In the third step, the mask 105 used in the second step is used without being removed. That is, the implantation of the ions is performed for the semiconductor substrate 100 using the same mask, in the second and third steps.

Using the method of manufacturing a JFET according to the present embodiment, positional shift between the channel region and the source region can be inhibited, the positional shift caused by performing implantation of ions using different masks in the second step and the third step.

Here, either of the second and third steps may be performed first. Further, the implantation of the ions in the second and third steps may be performed on condition that the second semiconductor region 113 and the third semiconductor region 114 partially overlap.

However, ion implantation energy (second ion implantation energy) upon the implantation of ions in the third step is preferably smaller than ion implantation energy (first ion implantation energy) upon the implantation of ions in the second step. Therefore, the channel region can be readily disposed at a position of the semiconductor substrate, deeper than the source region, below the surface of the semiconductor substrate.

Further, various ion species can be used for the implantation of ions in the second and third steps. For example, when performing implantation of N-type ions, arsenic, phosphorus, or the like can be used. When performing implantation of P-type ions, boron can be used. The ion species may be different between the second and third steps. For example, an impurity used in the second step can have a diffusion coefficient smaller than that of an impurity used in the third step to readily dispose the semiconductor region formed in the third step, on the surface side of the semiconductor substrate relative to the semiconductor region formed in the second step.

Embodiments of the present invention will be described below using specific exemplary embodiments.

In each exemplary embodiment, the JFET having a P-type gate region will be described. However, the gate region is not limited to have the P-type conductivity, and each embodiment can be applied to a JFET having an N-type gate region obtained by forming each semiconductor region to have the opposite conductivity type.

First Exemplary Embodiment

The method of manufacturing a JFET according to the present exemplary embodiment will be described using FIGS. 2A to 2C, and FIGS. 3A to 3I. In the drawings, parts having functions similar to those of FIGS. 1A and 1B are denoted by the same reference signs, and detailed description will be omitted.

Figure 2C:
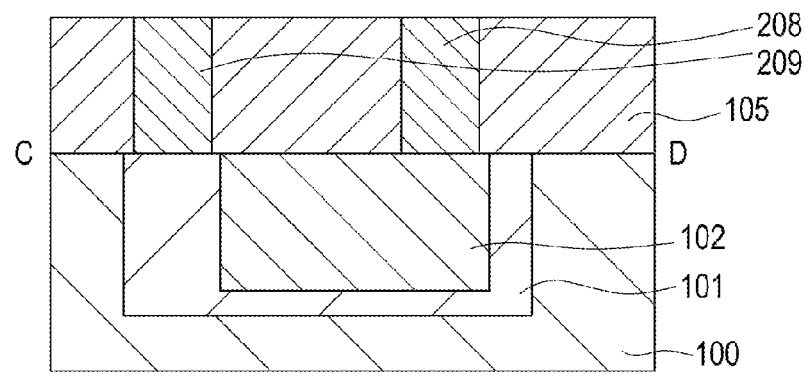

First, FIGS. 2A to 2C illustrate a configuration of the JFET at which the contact plugs have been formed. FIG. 2A is a schematic plan view of the JFET 110 according to the present exemplary embodiment. The schematic plan view is a diagram illustrating the JFET 110 viewed from above. Further, the plan view is a top view of the semiconductor substrate 100. The above description will be applied also in the following embodiments.

FIG. 2B is a schematic cross-sectional view taken along a line A-B of FIG. 2A, and FIG. 2C is a schematic cross-sectional view taken along a line C-D of FIG. 2A. The schematic cross-sectional view is a diagram illustrating the JFET 110 taken in cross-section. The cross-sectional view is a front view of a cross-section of the semiconductor substrate.

The JFET 110 is disposed in the semiconductor substrate 100. The semiconductor substrate 100 represents the whole of a substrate including a semiconductor, and represents the whole of a member in which the semiconductor regions constituting the JFET 110 are disposed. The JFET 110 includes an N-type drain region 101, a P-type gate region 102, an N-type source region 104, and an N-type channel region 103. A contact plug 209 is electrically connected to the drain region 101. A contact plug 208 is electrically connected to the gate region 102. A contact plug 207 is electrically connected to the source region 104. The contact plugs 207, 208, and 209 are disposed in the mask 105 as an insulation film.

The source region 104 is disposed to include part of the surface of the semiconductor substrate 100. The channel region 103 is disposed at a position of the semiconductor substrate 100, deeper than the source region 104. The source region 104 and the channel region 103 are disposed to be superposed in plan view, and are held in the gate region 102. The gate region 102 and the source region 104, and the gate region 102 and the channel region 103 form a PN junction.

The drain region 101 is disposed to surround the gate region 102, the source region 104, and the channel region 103, in plan view. The drain region 101 may include an N-type semiconductor substrate, or a P-type well may be formed in the N-type semiconductor substrate, and an N-type semiconductor region may be partially formed in the P-type well.

The semiconductor substrate 100 has an upper portion over which the mask 105 and a wiring layer not illustrated are disposed. The insulation film forming the mask 105 can include an inorganic material such as a silicon oxide film, a silicon nitride film, or a silicon oxynitride film. Silicon glass may be used which is doped with an impurity to silicon such as a boron phosphorus silicon glass (BPSG) film. The mask 105 functions as an interlayer insulation film disposed between the semiconductor substrate 100 and the wiring layer.

Figure 3A:
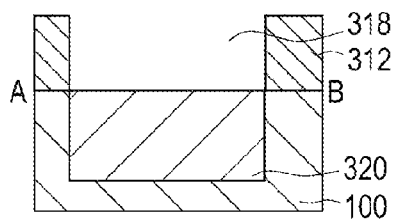
FIGS. 3A to 3I are schematic cross-sectional views illustrating a method of manufacturing a JFET.
Figure 3B:
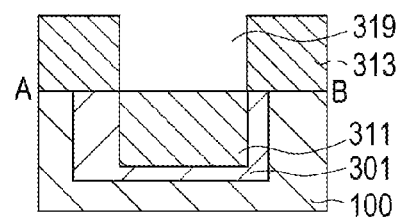
Figure 3C:
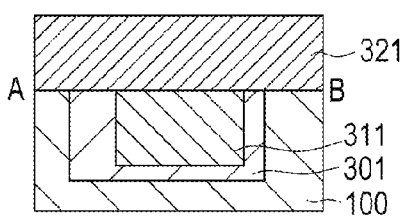
Figure 3D:
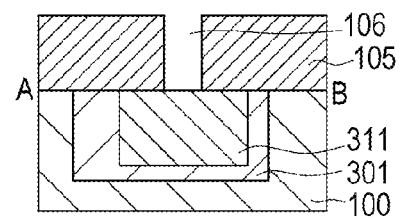
Figure 3E:
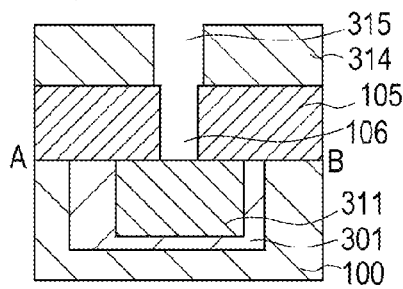
Figure 3F:
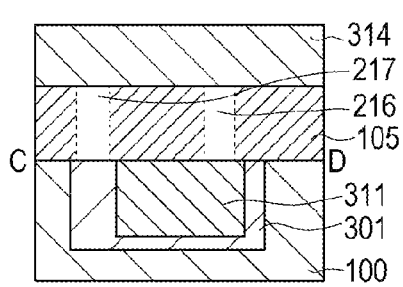

Next, FIGS. 3A to 3I illustrate a method of manufacturing the JFET 110 according to the present exemplary embodiment. FIGS. 3A to 3E, and 3G to 3I illustrate a manufacturing process in a cross-section taken along a line A-B of FIG. 2A. FIG. 3F is a schematic cross-sectional view of a step of FIG. 3E, taken along a line C-D of FIG. 2A.

First, the semiconductor substrate 100 is prepared on which an N-type semiconductor region 320 (fourth semiconductor region) is disposed. The semiconductor substrate 100 may be prepared on which the N-type semiconductor region 320 is previously disposed, or the semiconductor substrate 100 may be prepared on which the N-type semiconductor region 320 is not formed to form the N-type semiconductor region 320 in the semiconductor substrate by implantation of ions or the like. The latter method will be described below.

First, a photoresist film is formed over the surface of the semiconductor substrate 100 including a silicon wafer or the like. Then, a photolithography process is used to perform patterning of the photoresist film, and a mask 312 having an opening portion 318 is formed.

The mask 312 is used to perform implantation of N-type ions in the semiconductor substrate 10, and the N-type semiconductor region 320 is formed in the semiconductor substrate 100. The mask 312 is thereafter removed.

Next, in FIG. 3B, a mask 313 (third mask) is formed on the surface of the semiconductor substrate 100, in a manner similar to manufacturing the mask 312. The mask 313 has an opening portion 319 (third opening portion). The opening portion 319 is surrounded by the N-type semiconductor region 320 of FIG. 3A, in plan view. That is, the outer edge of the opening portion 319 is disposed on the inside of the outer edge of the N-type semiconductor region 320, in plan view. The mask 313 is used to perform implantation of P-type ions in the semiconductor substrate 100, and a P-type semiconductor region 311 (first semiconductor region) is formed. Here, an area of the N-type semiconductor region 320, which remains as the N-type semiconductor region without the implantation of the P-type ions, is defined as an N-type semiconductor region 301. As described below, the N-type semiconductor region 301 is defined as a drain region.

Then, in FIG. 3C, an insulation film 321 is formed over the surface of the semiconductor substrate 100. The insulation film 321 may include an inorganic material such as a silicon oxide film, a silicon nitride film, or a silicon oxynitride film. Alternatively, silicon glass may be used which is doped with an impurity such as a boron phosphorus silicon glass (BPSG) film.

Next, in FIG. 3D, the insulation film 321 disposed over the P-type semiconductor region 311 is partially etched, and the mask 105 having an opening portion 106 (first opening portion) is formed (first step). The etching of the opening portion 106 is performed using a mask formed using a photoresist film not illustrated.

In the first step, opening portions 216 and 217, not illustrated, are simultaneously formed. The contact plug 208 illustrated in FIG. 2C is disposed in the opening portion 216, and the contact plug 209 illustrated in FIG. 2C is disposed in the opening portion 217.

Next, in FIGS. 3E and 3F, a mask 314 (second mask) having an opening portion 315 (second opening portion) disposed to surround the opening portion 106, in plan view, and covering the opening portions 216 and 217 is formed over the mask 105. The mask 314 is formed by patterning the photoresist film formed over the mask 105, using a photolithography process.

Figure 3G:
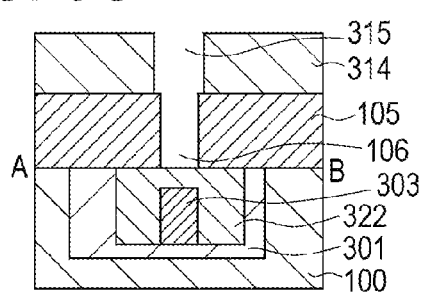

Next, in FIG. 3G, the masks 105 and 314 are used to perform implantation of N-type ions in part of the P-type semiconductor region 311, and an N-type semiconductor region 303 (second semiconductor region) is formed. Here, an area of the P-type semiconductor region 311, which remains as the P-type semiconductor region without the implantation of the N-type ions, is a P-type semiconductor region 322. The N-type semiconductor region 303 is formed to a depth at which the N-type semiconductor region 303 is electrically connected to the N-type semiconductor region 301. Typically, the N-type semiconductor region 303 is formed to a depth reaching the N-type semiconductor region 301. Further, in FIG. 3G, the P-type semiconductor region 322 is disposed between the surface of the semiconductor substrate 100 and the N-type semiconductor region 303, but the N-type semiconductor region 303 may be formed from the surface of the semiconductor substrate 100 to the depth at which the N-type semiconductor region 303 is electrically connected to the N-type semiconductor region 301. Further, the N-type semiconductor region 303 may be formed by a plurality of times of implantation of ions having different ion implantation energies, and having different dosages (second step).

Figure 3H:
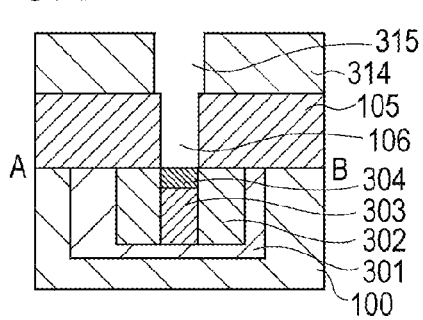

Next, in FIG. 3H, the masks 105 and 314 are used to perform implantation of N-type ions, and an N-type semiconductor region 304 (third semiconductor region) is formed at a position shallower than the N-type semiconductor region 303. Here, ion implantation energy for forming the N-type semiconductor region 304 is set lower than ion implantation energy for forming the N-type semiconductor region 303 to form the N-type semiconductor region 304. Therefore, the N-type semiconductor region 304 is formed at a position at which the N-type semiconductor region 304 is electrically connected to the N-type semiconductor region 303 (third step). Here, the N-type semiconductor region 304 is formed in part of the P-type semiconductor region 322. When the N-type semiconductor region 303 is disposed to the surface of the semiconductor substrate 100, the N-type semiconductor region 304 is formed in part of the N-type semiconductor region 303. That is, in this configuration, part of the N-type semiconductor region 303 is defined as the channel region, and the other part thereof is defined as the source region. Accordingly, the N-type semiconductor region 303 is an area defined as at least part of the channel region. It is noted that, after the third step and before formation of the contact plug 207, the semiconductor substrate 100 may be heat-treated to diffuse the impurities. Then, the mask 314 is removed.

Figure 3I:
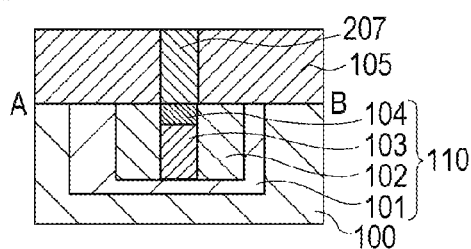

As illustrated in FIG. 3I, a conductive body is embedded in the opening portion 106 and the opening portions 217 and 218 illustrated in FIG. 3F to form the contact plugs 207, 208, and 209. Accordingly, the opening portions 106, 107, and 108 are contact holes. As described above, the opening portion 106 formed in the mask 105 used for the second step is used to form the contact plug 207, and the positional shift of the contact plug 207 with respect to the source region 104 can be inhibited. Therefore, the contact plug 207 and the P-type gate region 102 make contact with each other, and a gate and a source of the JFET are inhibited from being short-circuited.

The JFET 110 is completed by the method having been described above. The N-type semiconductor region 320, the N-type semiconductor region 304, and the N-type semiconductor region 303 of FIG. 3H constitute the drain region 101, the source region 104, and the channel region 103 of FIG. 3I, respectively.

After the JFET 110 is formed by the above-mentioned method, wiring or the like is formed on the semiconductor substrate 100 by a well-known method, and a semiconductor apparatus having the JFET 110 is completed.

According to the present exemplary embodiment, the positional shift between the source region and the channel region can be reduced. Further, the semiconductor region constituting the source region is formed using the contact hole, and the short-circuit between the contact plug and the gate can be inhibited.

Second Exemplary Embodiment

Figure 4A:
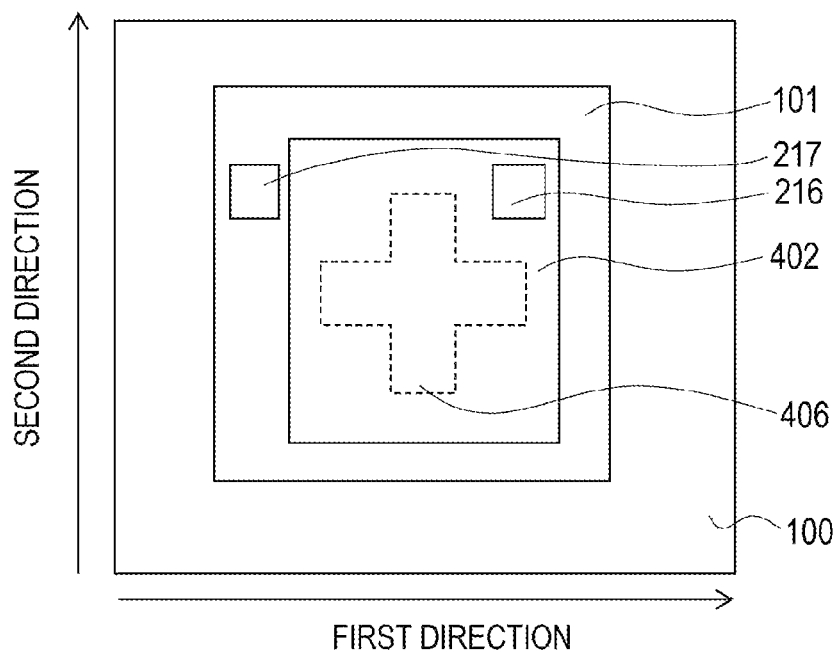
FIG. 4A is a schematic plan view of a JFET.
Figure 4B:
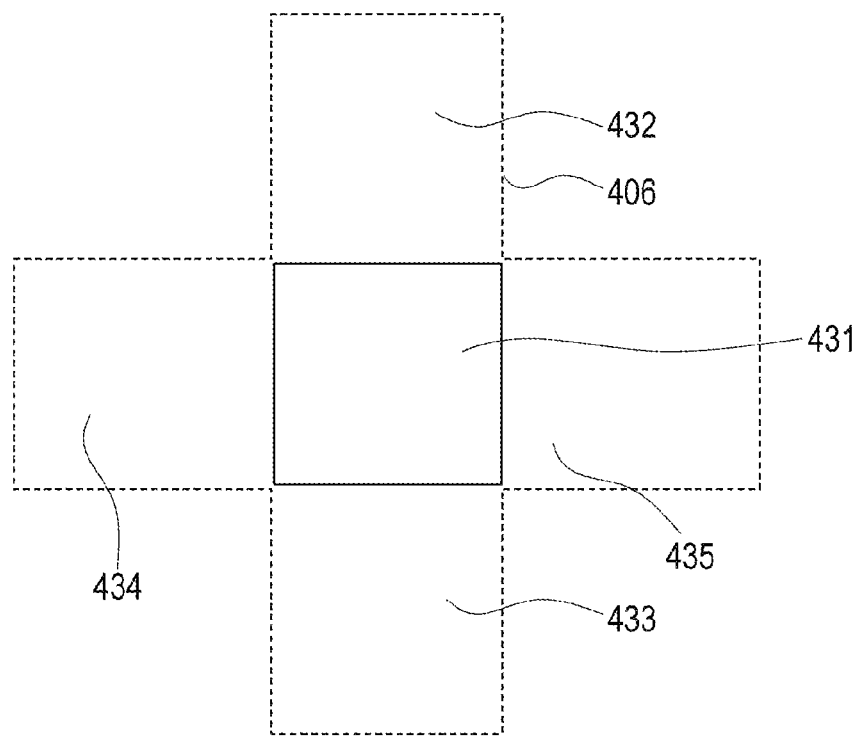
FIG. 4B is a schematic cross-sectional view of the JFET.

A schematic plan view of a JFET according to the present exemplary embodiment is illustrated in FIG. 4A. FIG. 4B is a schematic plan view of an opening portion 406 of FIG. 4A, illustrating the opening portion 406 enlarged. Parts having functions similar to those of the first exemplary embodiment are denoted by the same reference signs, and detailed description will be omitted.

The present exemplary embodiment is different from the first exemplary embodiment in shape of the mask for implantation of ions, in plan view. In the first exemplary embodiment, the mask has a rectangular shape, but in the present exemplary embodiment, the mask has a cross-shape.

A gate region 402 of the present exemplary embodiment corresponds to the gate region 102, and the opening portion 406 of the present exemplary embodiment corresponds to the opening portion 106 of the first exemplary embodiment.

As illustrated in FIG. 4B, the opening portion 406 includes a first area 431, a fourth area 432, a fifth area 433, a third area 434, and a second area 435. The first area 431 is disposed in an area including the center of the opening portion 406. An area disposed in a second direction from the first area 431 is the fourth area 432.

An area on the opposite side of the fourth area 432 across the first area 431 is the fifth area 433. An area disposed in a first direction to the first area 431 is the second area 435. An area on the opposite side of the second area 435 across the first area 431 is the third area 434.

Generally, when an area of the channel region is increased in plan view, the JFET 410 is operated quickly. However, in the JFET 410 controlled in operation according to a degree of depletion of the channel region, a depletion voltage being a voltage for depleting the channel region is increased. The channel region is formed into a cross shape in plan view, so that an area of the channel region can be increased in plan view, without increasing a length of the channel region held in the gate region 402.

Accordingly, use of the mask having the opening portion 406 of a shape as illustrated in FIG. 4B for implantation of the ions in the second and third steps as described above, allows manufacture of the JFET operating quickly while inhibiting the increase in depletion voltage in addition to the effects of the first exemplary embodiment.

Third Exemplary Embodiment

Figure 5A:
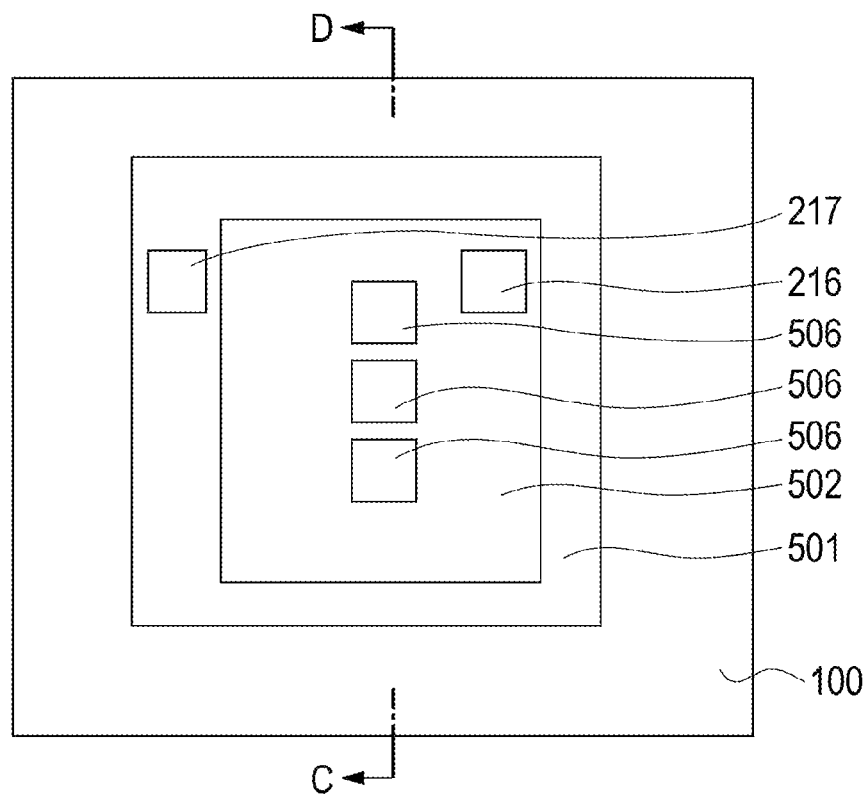
FIG. 5A is a schematic plan view of a JFET.
Figure 5B:
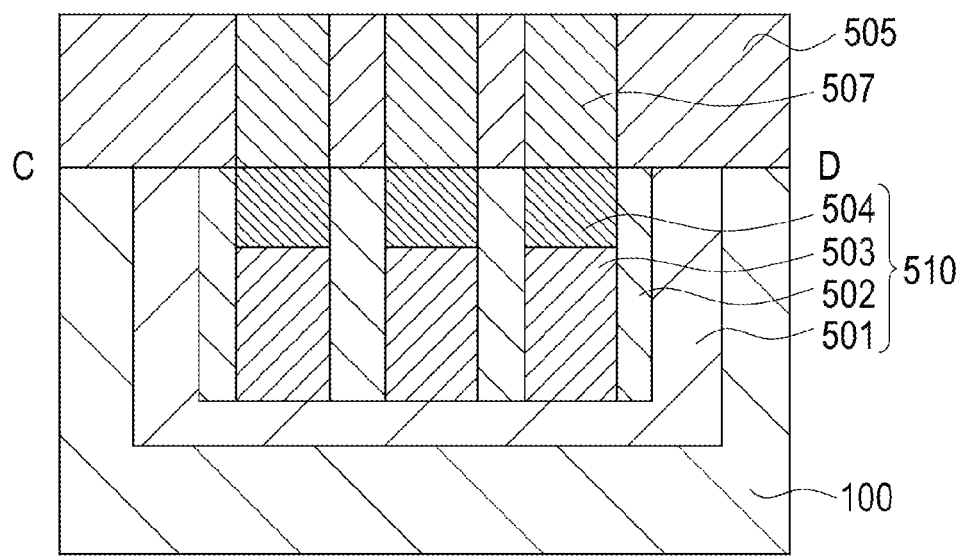
FIG. 5B is a schematic cross-sectional view of the JFET.

A JFET according to a third exemplary embodiment of the present invention is illustrated in FIG. 5A. FIG. 5A is a schematic plan view of the JFET according to the present exemplary embodiment. FIG. 5B is a schematic cross-sectional view taken along a line C-D of FIG. 5A.

Parts having functions similar to those of the first exemplary embodiment are denoted by the same reference signs, and detailed description will be omitted. The present exemplary embodiment is different from first exemplary embodiment in that a plurality of opening portions for forming semiconductor regions defined as source regions and channel regions are disposed in one JFET. Here, the one JFET is a configuration having, as a gate region, one semiconductor region defined by an N-type semiconductor region or an element isolation region as an insulator.

In the present exemplary embodiment, a mask 505 corresponds to the mask 105 of the first exemplary embodiment, an opening portion 506 corresponds to the opening portion 106 of the first exemplary embodiment, and a source region 504 corresponds to the source region 104 of the first exemplary embodiment. Further, a channel region 503 corresponds to the channel region 103 of the first exemplary embodiment, and a gate region 502 corresponds to the gate region 102 of the first exemplary embodiment. A drain region 501 corresponds to the drain region 101 of the first exemplary embodiment, and a contact plug 507 corresponds to the contact plug 207 of the first exemplary embodiment.

The present exemplary embodiment is different from the first exemplary embodiment in that the mask 505 having the plurality of opening portions 506 surrounded by the same P-type semiconductor region in plan view is disposed, and a plurality of the contact plugs 507, the source regions 504, and the channel regions 503 are formed. Here, "the same" represents a semiconductor region forming one area in plan view.

This configuration will be described below.

As illustrated in FIG. 5A, in the present exemplary embodiment, three contact plugs 507 are formed for one JFET 510.

Therefore, as illustrated in FIG. 5B, the mask 505 has the plurality of opening portions 506. The plurality of opening portions 506 are disposed to be surrounded by the P-type semiconductor region 311 of FIG. 3E in plan view.

Then, N-type ions are implanted in part of the P-type semiconductor region 311 of FIG. 3E through the plurality of opening portions 506, and the plurality of the source regions 504 and the plurality of the channel regions 503 are formed through the plurality of opening portions 506. The gate region 502 is constituted by the other part of the P-type semiconductor region 311.

The plurality of the source regions 504 are disposed including the surface of the semiconductor substrate 100.

The plurality of the channel regions 503 are electrically connected to the source regions 504, respectively, and disposed in a direction perpendicular to the surface of the semiconductor substrate 100. The plurality of the source regions 504 and the plurality of the channel regions 503 are held in the gate region 502, along a direction perpendicular to the surface of the semiconductor substrate 100.

All of the plurality of the channel regions 503 are electrically connected to the drain region 501 disposed in common in a depth direction of the semiconductor substrate 100, and constitutes one JFET 510.

Further, the contact plug 507 is formed in each of the plurality of opening portions 506. The contact plugs 507 are electrically connected to the plurality of source regions 504 formed in the opening portions 506, respectively.

In the present exemplary embodiment, signal charges are accumulated in the gate region 502 to control depletion of each of the plurality of channel regions 503, and the drive of the JFET 510 is controlled.

As described above, since the JFET has a configuration including the plurality of opening portions 506, the channel region 503 can be substantially widely formed, while inhibiting the increase in depletion voltage. Therefore, the drive of the JFET 510 can be improved. Here, three opening portions 506 are employed as a typical example, but any number of opening portions may be employed as long as at least one opening portion is employed. According to such a configuration, the JFET 510 can be driven at a high speed. This configuration can be also applied to the other exemplary embodiments.

(Exemplary Application to Imaging Apparatus)

The JFETs manufactured using the methods of manufacturing a JFET according to the first to third exemplary embodiments can be used for various semiconductor apparatuses. Here, an imaging apparatus will be described as an example of the semiconductor apparatus.

Figure 6:
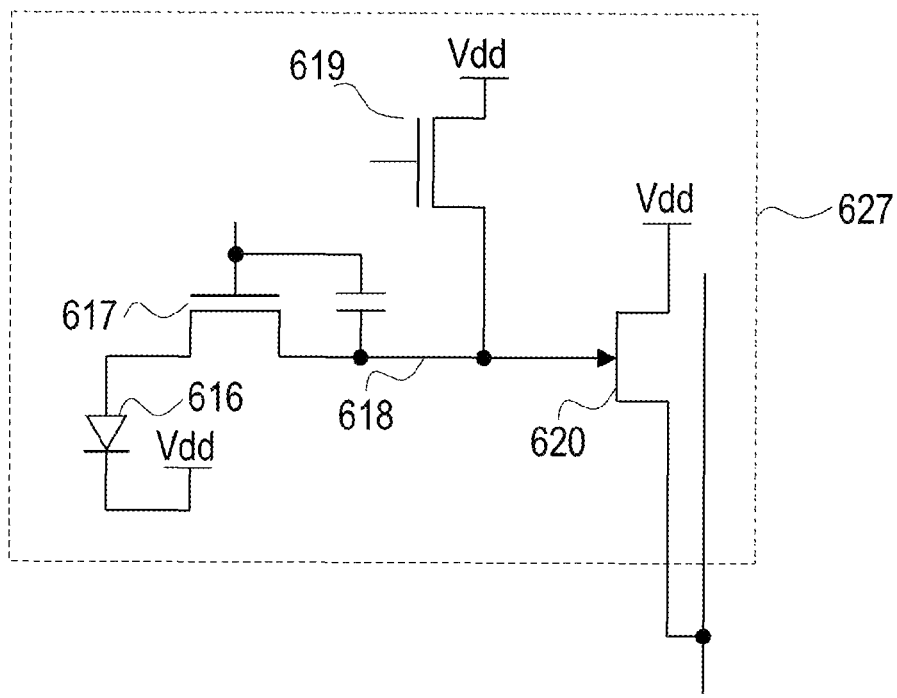
FIG. 6 is a circuit diagram of an imaging apparatus.
Figure 7A:
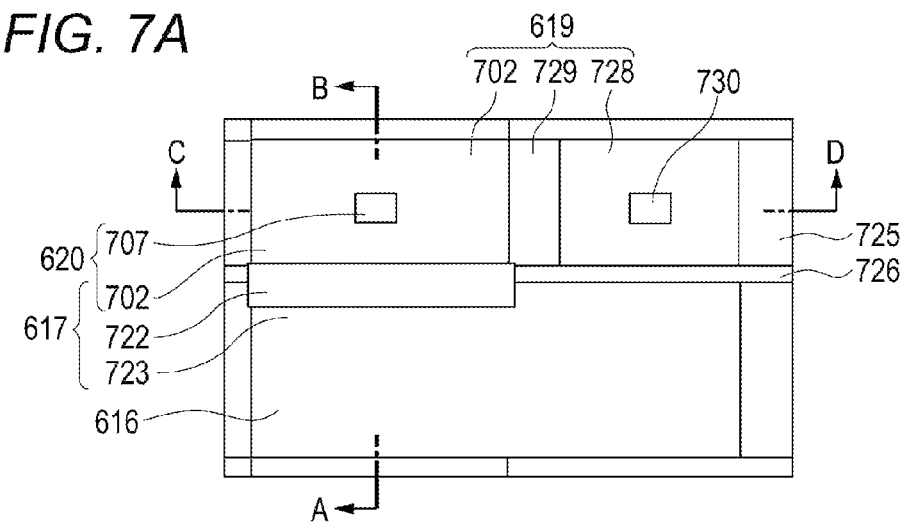
FIG. 7A is a schematic plan view of an imaging apparatus.
Figure 7B:
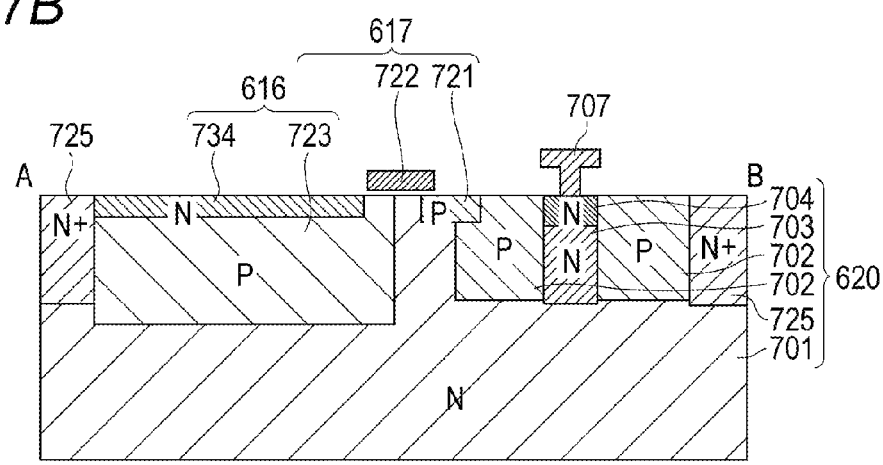
FIGS. 7B and 7C are schematic cross-sectional views of the imaging apparatus.
Figure 7C:
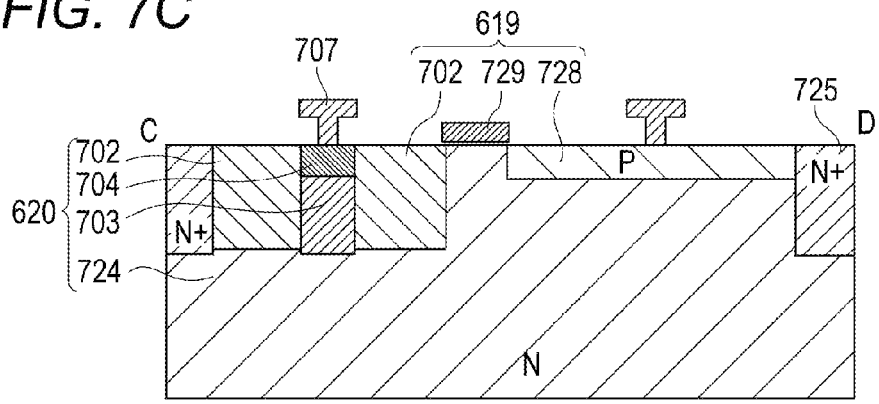

A circuit diagram of one pixel of an imaging apparatus using a JFET obtained by a method of manufacturing a JFET according to an embodiment of the present invention is illustrated in FIG. 6. Further, a schematic plan view of the one pixel of the imaging apparatus is illustrated in FIG. 7A, and cross-sectional views of the one pixel of the imaging apparatus are illustrated in FIGS. 7B and 7C.

In the present exemplary embodiment, the JFET 110 is used as an amplifying transistor 620 for a pixel.

Further, in the present exemplary embodiment, a description will be made on condition that the signal charges are holes, and each transistor is a P-type MOS transistor and an N-type JFET.

In FIG. 6, a photoelectric conversion unit generates charge pairs having an amount according to an amount of incident light by photoelectric conversion, and accumulates holes as the signal charges. For example, here, a photodiode 616 is used as the photoelectric conversion unit.

A transfer unit transfers the holes generated in the photodiode 616. For example, here, a transfer transistor 617 is used as the transfer unit. The transfer transistor 617 transfers the holes in the photodiode 616 to an input node of the amplifying transistor 620 described below.

A charge holding unit 618 holds the holes generated in the photodiode 616 and transferred from the transfer transistor 617. The charge holding unit 618 includes a gate region of the amplifying transistor 620, disposed in the semiconductor substrate 100. The gate region includes the P-type semiconductor region.

An amplification unit includes the amplifying transistor 620, and amplifies and outputs a signal based on the holes transferred from the transfer transistor 617.

The amplifying transistor 620 has a drain to which a predetermined voltage is supplied. The amplifying transistor 620 can constitute a source follower circuit together with a power source not illustrated.

A reset unit sets at least the potential of FD to a predetermined potential. For example, here, a reset transistor 619 is used as the reset unit. The reset transistor 619 has a source electrically connected to a gate of the amplifying transistor 620. Further, the reset transistor 619 has a drain to which a predetermined voltage is supplied. Therefore, the reset transistor 619 can set the potential of the gate of the amplifying transistor 620 to a predetermined potential.

FIG. 7A is a schematic plan view of one pixel, FIG. 7B is a schematic cross-sectional view taken along a line A-B of FIG. 7A, and FIG. 7C is a schematic cross-sectional view taken along a line C-D of FIG. 7A.

Here, an N-type semiconductor region 704 corresponds to the source region 104. Further, an N-type semiconductor region 703 corresponds to the channel region 103, and a P-type semiconductor region 702 corresponds to the gate region 102. An N-type semiconductor region 701 corresponds to the drain region 101, and a contact plug 707 corresponds to the contact plug 207.

In the pixel 627, an insulator isolation portion 726 and a PN junction isolation layer 725 define an area in which elements are formed. In the areas, the photodiode 616, the transfer transistor 617, the amplifying transistor 620, and the reset transistor 619 are disposed.

As illustrated in FIG. 7B, the photodiode 616 has a PN junction including a P-type semiconductor region 723 and the N-type semiconductor region 701. Further, an N-type semiconductor region 734 is disposed over a surface of the P-type semiconductor region 723 to configure the photodiode 616 embedded. The holes generated by incident light are accumulated as the signal charges in the P-type semiconductor region 723.

The transfer transistor 617 includes the P-type semiconductor region 723, a gate electrode 722, and a P-type semiconductor region 721. The holes accumulated in the P-type semiconductor region 723 are transferred to the P-type semiconductor region 721 by the transfer transistor 617. Here, the P-type semiconductor region 721 is disposed, but the P-type semiconductor region 702 may accumulate the holes from the P-type semiconductor region 723 without providing the P-type semiconductor region 721. The P-type semiconductor region 702 is disposed at a position away from the P-type semiconductor region 723 constituting the photodiode 616.

The imaging apparatus can be manufactured by forming the semiconductor region (P-type semiconductor region 723) for accumulating the holes from the photoelectric conversion unit, at a position away from the P-type semiconductor region 702 (first semiconductor region), in addition to the steps of manufacturing the JFET having been described in the above exemplary embodiments.

Here, a reason for use of the JFET 110 for the amplifying transistor 620 will be described. First, when the MOS transistor is used for the amplifying transistor 620, the gate electrode of the amplifying transistor is formed on an active region. Therefore, the P-type semiconductor region 721 and the gate electrode constituting the FD need to be electrically connected by wiring.

Whereas, when the JFET 110 is used for the amplifying transistor 620, the P-type semiconductor region 702, as the gate region of the JFET 110, includes the P-type semiconductor region. Therefore, the P-type semiconductor region 721 and the P-type semiconductor region 702 are only required to electrically connect their areas. Further, the P-type semiconductor regions can be formed as the same area.

Therefore, the imaging apparatus can reduce wiring resistance or parasitic capacitance, and can be miniaturized without wiring. Further, the JFET 110 is formed at the amplifying transistor 620, so that influence of 1/f noise generated at an interface between a gate oxide film and a silicon substrate can be inhibited, compared with the MOS transistor.

As illustrated in FIG. 7C, the reset transistor 619 includes a P-type semiconductor region 728 defined as a drain region, a gate electrode 729, and the P-type semiconductor region 702 defined as a source region. Further, the P-type semiconductor region 702 constitutes the gate region of the JFET 110.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-176298, filed Aug. 29, 2014, which is hereby incorporated by reference herein in its entirety.

What is claimed is:

1. A method of manufacturing a junction field effect transistor having a channel region disposed at a position of a semiconductor substrate, deeper than one of a source region and a drain region, the method comprising:

a first step of forming a first mask over the semiconductor substrate in which a gate region of the junction field effect transistor formed by a first semiconductor region of a first conductivity type is disposed to be surrounded by another of the source region and the drain region formed by a semiconductor region of a second conductivity type opposite to the first conductivity type, the first mask having a first opening portion disposed to be surrounded by the gate region in plan view;

a second step of forming a channel region of the junction filed effect transistor formed by a second semiconductor region of the second conductivity type, in a partial area of the first semiconductor region, by implantation of ions of the second conductivity type, using the first mask; and a third step of forming the one of the source and the drain region of the junction field effect transistor by a third semiconductor region of the second conductivity type, by the implantation of ions of the second conductivity type, using the first mask, wherein the source region, the drain region, and the channel region of the junction field effect transistor are formed by the first step, the second step, and the third step so as to be disposed in this order in a depth direction and be superposed in plan view.

2. The method of manufacturing a junction field effect transistor according to claim 1, wherein the third step is performed after the second step.

3. The method of manufacturing a junction field effect transistor according to claim 1, wherein the third step is performed before the second step.

4. The method of manufacturing a junction field effect transistor according to claim 1, wherein the first opening portion is a contact hole.

5. The method of manufacturing a junction field effect transistor according to claim 4, wherein the contact hole includes a plurality of contact holes disposed to superpose the one of a source region and a drain region of the junction field effect transistor, and a gate region, respectively, in plan view,
- the method further comprising forming a second mask, after the first step, the second mask covering the contact holes disposed to superpose the gate region and the other of the source region and the drain region, in plan view, and having a second opening portion disposed to superpose, in plan view, the contact hole disposed to superpose the one of the source region and the drain region in plan view,
- wherein the implantation of ions in the second and third steps is performed using the first and second masks.

6. The method of manufacturing a junction field effect transistor according to claim 4, further comprising heat-treating the semiconductor substrate, after the second and third steps, and before contact plugs are formed in the contact holes.

7. The method of manufacturing a junction field effect transistor according to claim 1, wherein the implantation of ions in the second step includes a plurality of times of implantation of ions having different energies and different dosages.

8. The method of manufacturing a junction field effect transistor according to claim 1, wherein the first opening portion includes:
- a first area;
- a second area disposed in a first direction from the first area;
- a third area disposed opposite to the second area across the first area;
- a fourth area disposed in a second direction different from the first direction, to the first area; and
- a fifth area disposed opposite to the fourth area across the first area.

9. The method of manufacturing a junction field effect transistor according to claim 1, further including forming a third mask over the semiconductor substrate in which a fourth semiconductor region of second conductivity type is disposed, the third mask having a third opening portion disposed to be surrounded by the fourth semiconductor region in plan view, wherein
- the first semiconductor region is formed in a partial area of the fourth semiconductor region by implantation of ions of the first conductivity type, using the third mask, and
- an area of the fourth semiconductor region covered by the third mask and not implanted with ions of the first conductivity type is defined as the semiconductor region.

10. The method of manufacturing a junction field effect transistor according to claim 1, wherein
- the first mask has a plurality of the first opening portions surrounded by the one first semiconductor region, in plan view.

* * * * *